US006342398B1

(12) United States Patent
Lin

(10) Patent No.: US 6,342,398 B1
(45) Date of Patent: Jan. 29, 2002

(54) METHOD OF BACKSIDE EMISSION ANALYSIS FOR BGA PACKAGED IC'S

(75) Inventor: Yu-Ting Lin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/213,452

(22) Filed: Dec. 17, 1998

(51) Int. Cl.[7] ............................................. G01R 31/26
(52) U.S. Cl. ........................... 438/14; 438/15; 438/122; 438/83; 257/700; 257/697; 257/698; 257/701; 257/778
(58) Field of Search .................... 438/14, 15; 257/700, 257/697, 698, 701; 483/122; 324/755

(56) References Cited

U.S. PATENT DOCUMENTS

| 5,424,254 | A |   | 6/1995  | Damiot ...................... 437/243 |
| 5,570,033 | A |   | 10/1996 | Staab ......................... 324/761 |
| 5,615,006 | A | * | 3/1997  | Hirukawa ................... 356/124 |
| 5,712,570 | A |   | 1/1998  | Heo et al. ................... 324/538 |
| 5,959,348 | A | * | 9/1999  | Chang ......................... 257/700 |
| 6,052,287 | A | * | 4/2000  | Palmer ........................ 361/767 |
| 6,069,366 | A | * | 5/2000  | Goruganthu ........... 250/559.27 |
| 6,127,833 | A | * | 10/2000 | Wu ............................. 324/755 |
| 6,162,663 | A | * | 12/2000 | Schoenstein ................ 483/122 |

* cited by examiner

Primary Examiner—John F. Niebling
Assistant Examiner—Andre' C Stevenson
(74) Attorney, Agent, or Firm—George O. Saile; Stephen B. Ackerman

(57) ABSTRACT

A novel approach to detection of leakage site detection for BGA chips. The invention prevents damaging the semiconductor circuit that is a problem during conventional preparation for backside leakage detection for BGA chips. The invention teaches removing the backside from the BGA device and separating the BGA device into two parts. The back surface of the molded part within which the BGA chip is embedded remains undamaged within the scope of the present invention and can be electrically accessed to perform BGA die analysis.

10 Claims, 4 Drawing Sheets

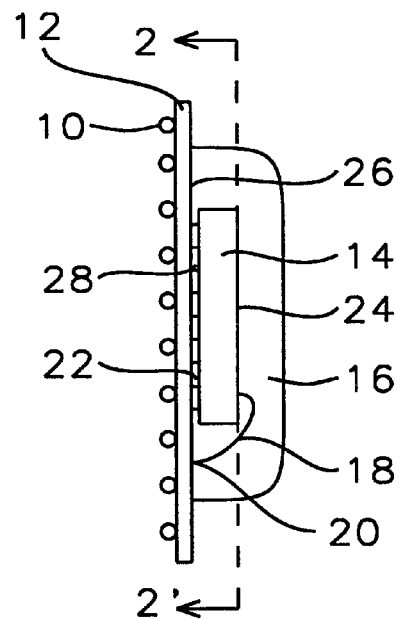
FIG. 1 — Prior Art
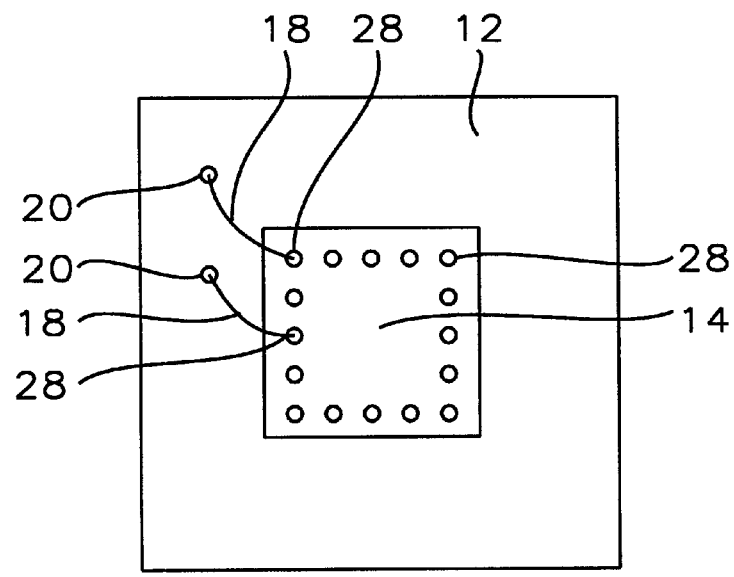
FIG. 2 — Prior Art

METHOD OF BACKSIDE EMISSION ANALYSIS FOR BGA PACKAGED IC'S

BACKGROUND OF THE INVENTION

(1) Field of the Invention

The invention relates to the testing of semiconductor devices, and more specifically to plastic packaged modules. The present invention relates to a method of opening the plastic packaged modules to access the semiconductor chip for chip analysis. The method of the present invention is applicable to plastic packaged modules even where the semiconductor chip is molded in a plastic encapsulating resin which is resistant to known etching techniques.

(2) Description of the Prior Art

The ability to remove encapsulated chips from a plastic package is required for various purposes, for instance for failure analysis of the encapsulated chip. Identification of the cause of failure of an encapsulated chip requires that the method of removing the chip from the encapsulating package does not effect the integrity of the chip and of the metallic interconnections to the chip. In a similar manner is it often required to physically evaluate semiconductor devices for product reliability, physical design and device structural patterns.

The quality of the chips that are removed from the encapsulating package is of prime importance in instances where the chips, which have been removed from the encapsulating package, need to be available for re-use after the chip analysis is completed.

In addition to aspects of chip functionality, the testability of the chip is also of concern. The method which is used to remove the chip from the package must not affect the functionality of the chip and must also assure that the chip remains in good condition and can be tested.

In sum, the basic problem to be addressed is to provide a method of gaining access to an encapsulated chip such that the physical and electrical integrity of the chip are maintained.

Wet chemical methods can be used to remove chips from the chip package. These methods however present problems because materials used for the wet process have a detrimental effect on chip functionality. At times very hard, etch resistant plastic resins are used as the molding compound for encapsulating a chip. The complete removal of this plastic resin without damaging the chip is a very difficult task because hard plastic resin cannot be attacked by an acid based wet process.

Another method of removing the chip from the package is to mechanically grind the chip-encapsulating package from the front side of the package, that is the side opposite to the side that exhibits the contact points or balls of the BGA. Emission microscopy allows for identifying sites within an integrated circuit where photons are generated due to the recombination of electrons with holes. Using emission microscopy the Integrated Circuit can therefore be analyzed for leakage sites within the integrated circuit.

The disadvantage of the latter method is that overlaying large metal lines within the structure of the chip may block the emission or leakage sites, these leakage sites may therefore remain undetected.

An alternate method of removing a chip from the chip encapsulation is to mechanically grind the chip encapsulation from the backside of the package. The backside of a BGA chip package is the side which is oriented towards the contact ball grid of the package. After the encapsulating layer has been removed in this manner down to the level of the ball bonds (also referred to as first bond) within the BGA, a socket is applied to the ball bonds. Electrical contact with the chip is established by means of this socket and through the ball bonds of the chip. In this way backside emission analysis, for instance, can be performed.

The disadvantage of this method is that it is very difficult to control the grinding process to the point where the ball bonds are not damaged while the bonding or contact wires which are attached to the ball bonds are also prone to be damaged during the grinding process. Also, using this approach, the chip die has to be exposed from the backside of the BGA chip by grinding underneath the die. This poses a problem if a BGA chip signal ball is located under the die and can therefore not be electrically contacted during subsequent procedures.

FIG. 1 shows a Prior Art cross section of the BGA device. The BGA die 14 is mounted in a plastic mold 16. The backside 22 of die 14 is oriented toward the printed circuit board 12 and the contact balls 10. The top side 24 of die 14 is facing away from the printed circuit board 12 or, which is the same thing, toward the bulk of the plastic mold 16. Wires 18 connect contact points in the top 24 of the die 14 with contact points 20 in surface 26. Cross section 2–2' is further explained under FIG. 2 following.

Points of electrical contact 28 between the die 14 and the printed circuit board 12 that are contained within the die are the first bond or ball bond contact points.

Points of electrical contact 20 between the top 24 of the die 14 and the printed circuit board 12 are the second bond or wedge bond contact points.

FIG. 2 further illustrates the above. It shows a top view of a cross section taken along line 2–2' of FIG. 1. This cross section is directly through the top surface 24 (FIG. 1) of the BGA die 14 and is looking in the direction of the printed circuit board 12. Contact pads (not shown) in surface 24 of the BGA die 14, these contact pads are connected by wires 18, which run within the chip molding 16 (FIG. 1) to the wedge bonds 20. The wedge bonds 20 are in the backside surface (the surface facing the BGA printed circuit board 12) of the molding 16.

The present invention addresses the above indicated problems and limitations of accessing a BGA chip for chip analysis and provides for a reliable method of detecting leakage sites within BGA integrated circuits by performing the leakage site detection from the backside of the BGA chip.

U.S. Pat. No. 5,424,254 (Damiot) shows a method of polishing the plastic encapsulating resin in order to expose conductors. However, this reference differs from the present invention.

U.S. Pat. No. 5,570,033 (Staab) disclose a probe to test BGA's.

U.S. Pat. No. 5,712,570 (Heo et al.) shows a method for checking the bonds in a BGA by means of an electrical process.

SUMMARY OF THE INVENTION

It is the primary objective of the present invention to provide a method for electrically accessing semiconductor chips within plastic encapsulated modules which is not detrimental to the chip functionality and testability.

It is another objective of the present invention to provide a method for electrically accessing semiconductor chips within plastic encapsulated modules which preserves the terminal connection system integrity.

It is another objective of the present invention to provide a method for electrically accessing semiconductor chips within plastic encapsulated modules which is applicable to any type of plastic encapsulating resin.

It is another objective of the present invention to provide a method for electrically accessing semiconductor chips within plastic encapsulated modules which is simple to execute and which is inexpensive.

It is another objective of the present invention to provide a method for electrically accessing semiconductor chips within plastic encapsulated modules which does not cause any contamination to the accessed chip and to any used or related semiconductor processing equipment.

According to the present invention, a wax mold, which forms a chip-supporting carrier, is provided. A box sized opening is created in the wax mold, this opening is slightly larger in size than the size of the BGA IC. The BGA IC is inserted into the created opening with the backside of the BGA chip facing upward or away from the chip-supporting carrier. The BGA device backside is now polished, this polishing creates an opening in the BGA package that is slightly larger than the size of the die that is mounted within the package. This opening therefore exposes the backside of the BGA die. Next the silicon substrate of the BGA die is polished. The critical next step is to remove the BGA chip-supporting medium, normally the printed circuit board onto which the BGA contact balls are mounted, from the molded, chip encapsulating plastic. At this point the original module has been split into two parts, that is the printed circuit board into which the contact balls of the BGA device are mounted, and the molded plastic part which contains the BGA chip. The printed circuit board is of no further interest. The molded part contains the die; the top surface of the die is connected to the plane that was, before the above indicated splitting, electrically connected with the printed circuit board by means of wires. The ends of these wires are points of electrical contact (wedge bonds) within this plane and therefore are points of electrical contact that connect with the top of the die. The bottom of the die also has electrical contact points. These electrical contact points reside directly within the die and are referred to as first bond or ball bonds.

BRIEF DESCRIPTION OF THE DRAWINGS

In the accompanying drawing, forming an integral part of the description, there is shown:

FIG. 1 shows a Prior Art cross section of a BGA module.

FIG. 2 shows a Prior Art top view of the Printed Circuit Board of the BGA device.

DETAILED DESCRIPTION OF THE PREFERRED EMBODIMENT

Figure 3:
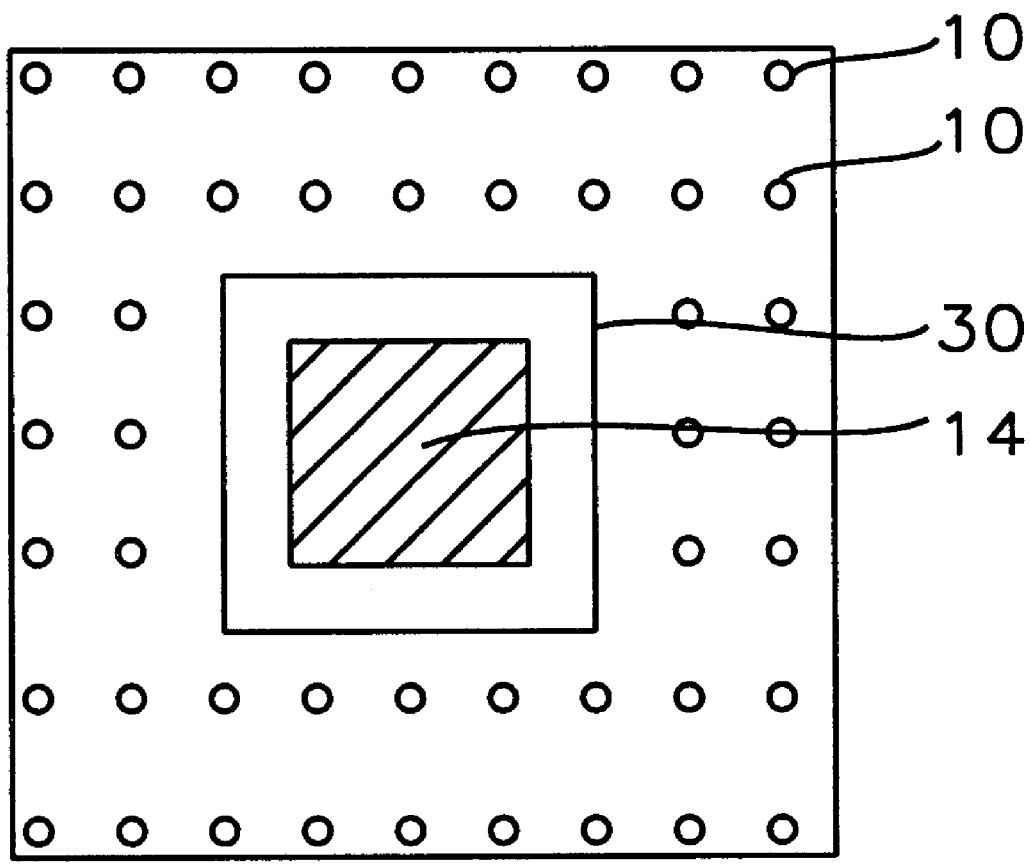
FIG. 3 shows the window opened in the backside of the BGA die and the surrounding ball array.

FIG. 3 shows a bottom view of the backside of the BGA device after the opening 30 has been created in the backside of the BGA module. Window 30 is, as is apparent from FIG. 3, slightly larger in size than the size of die 14. A few of the contact balls 10 of the BGA device have been highlighted.

Figure 4:
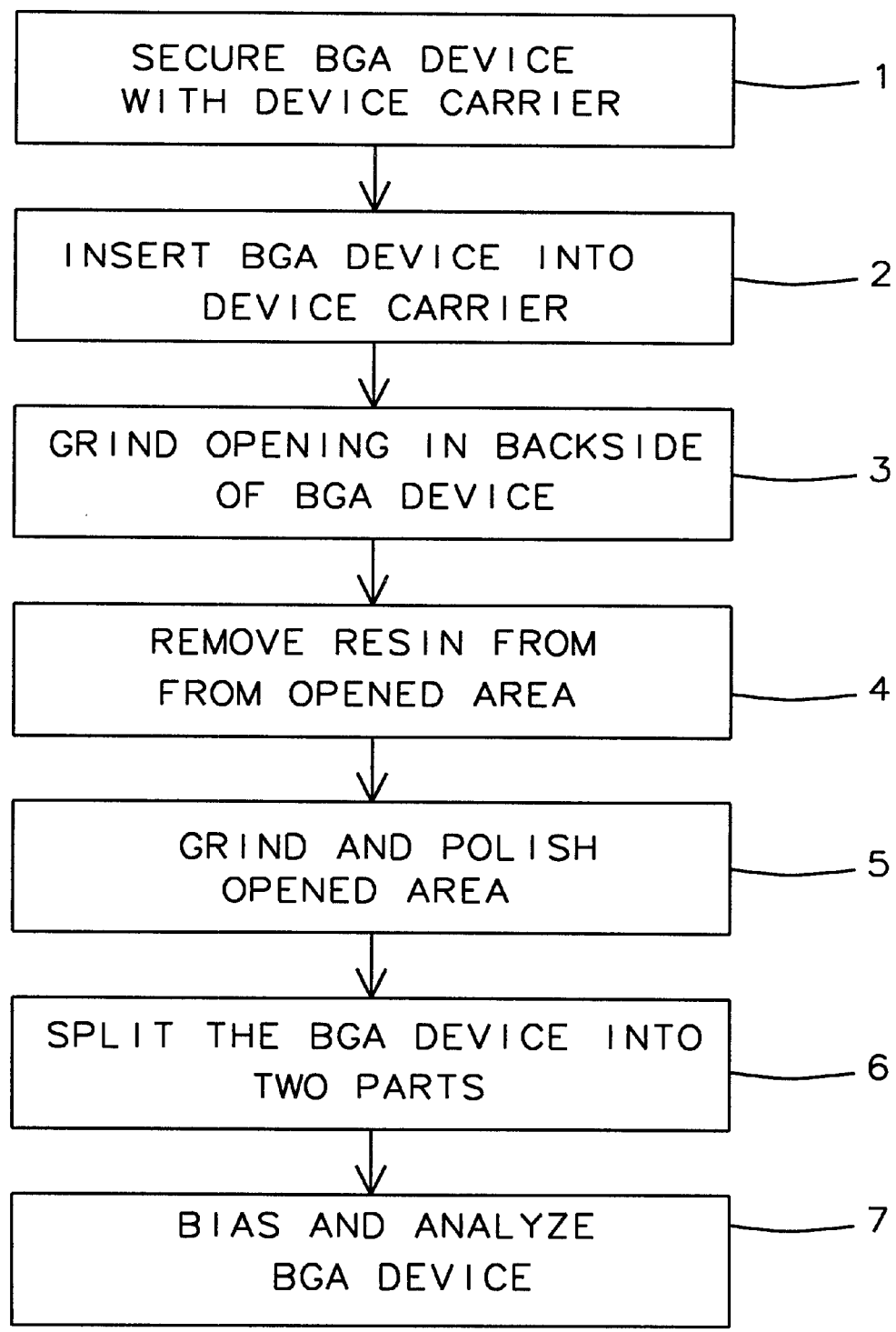
FIG. 4 shows a flow diagram of the steps to be performed within the scope of the present invention.

FIG. 4 shows the steps that are required within the scope of the present invention, the purpose of the indicated sequence is to provide an easy method for preparing the BGA die for analysis.

Step 1 shows the providing of a BGA device together with a BGA device carrier. As device carrier a solid wax mold can be used, within this mold a box shaped opening is created by grinding the mold. The inside dimensions of this opening are slightly larger than the outside dimensions of the plastic encapsulation of the BGA device, the plastic encapsulation of the BGA device fits snugly within the opening.

Step 2 shows that the BGA device is inserted into the opening within the BGA device carrier. The BGA device is inserted into the opening topside first such that the array of ball contact points of the BGA device faces upward or away from the device carrier.

Step 3 shows the opening of an area into the backside of the BGA module. This opening is directly under the BGA die and is slightly larger than the size of the BGA die (see FIG. 3), the device carrier holds the BGA module in place during the grinding operation that is used to create the opening. The grinding is continued until the backside of the die is exposed, a machine IC polisher can be used to perform the grinding.

Step 4 shows the cleaning of the backside of the BGA die by using nitric acid to remove the resin from the die backside.

Step 5 shows the polishing of the silicon substrate of the die backside by grinding and polishing within the open area.

Step 6 shows the separation of the printed circuit board substrate from the molded plastic part of the BGA device. This separation or splitting of the BGA device creates two parts, that is the molded plastic part and the printed circuit board substrate part. The separation of the BGA device occurs at the plane of the wedge bond or, which is the same plane, at the plane that forms the interface between the plastic mold of the BGA device and the printed circuit board of the BGA device. The BGA die together with the bonding wires remain encased within the plastic mold that has been separated from the BGA device PCB. The endpoints of the bonding wires that before the split were in contact with the PCB board, that is the wedge bond points, are now exposed in the newly created surface of the molded plastic part. These wire endpoints, the wedge bond points, are now available for BGA device analysis since electrical bias can be provided through these points to the BGA die.

Step 7 shows the function of biasing and analyzing the BGA die.

Figure 5:
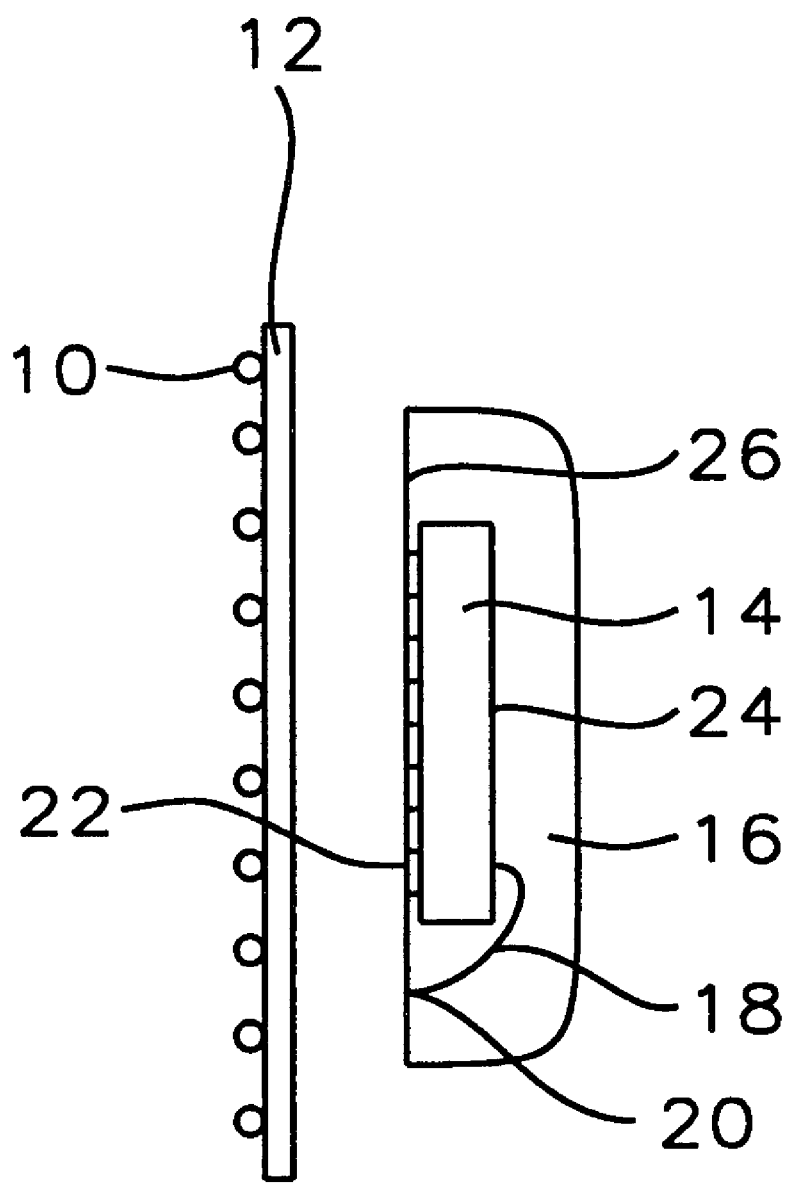
FIG. 5 shows the two separated parts of the BGA device.

FIG. 5 shows the two parts of the BGA device after completion of step 6, FIG. 4, above, that is the separation of the BGA printed circuit board 12 from the BGA molded plastic part 16. The various sub-constructs highlighted in FIG. 6 have previously been highlighted under FIG. 1.

The procedure highlighted has resulted in making the BGA device ready for device analysis, the Prior Art problems of damaging wedge bond wires and damaging contact balls of the BGA device have been eliminated by the device preparation sequence described above.

The method of the present invention allows the accessing of BGA chips encapsulated in any type of plastic encapsulating resin. Chips accessed by the method of the present invention exhibit 100% functionality and testability. In particular, the BGA chip contact zones have not been degraded and are ready for good electrical contact with the test probes. In addition, no physical or electrical degradation has been introduced as to the functionality of the BGA chip. The method of the present invention of accessing the BGA chip is very useful for accessing the BGA chip for examination or inspection or for purposes of electrical or functional analysis.

The method of the present invention provides a very successful method for leakage detection within BGA chip by analyzing these chips from the package backside. The method of the present invention, as opposed to Prior Art methods of accessing encapsulated BGA chips, avoids damaging the integrated circuit during the accessing of the chips. To bias the integrated circuit, the second bond wire of the plastic encapsulation can now be used to bias the integrated circuit.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method of backside emission analysis for packaged BGA chips, comprising the steps of:
   providing a BGA device having a backside and a front side, said BGA device comprising a printed circuit board having a first surface and a second surface in addition to comprising a molded plastic part having a first surface and a second surface, said second surface of said printed circuit board being in contact with said first surface of said molded plastic part, said molded plastic part comprising a BGA chip having a backside and a front side in or on the surface of said front side of said BGA chip having been created semiconductor circuits, said BGA device having a grid of contact balls mounted on said first surface of said printed circuit board said second surface of said printed circuit board having points of electrical contact that are in electrical contact with points of electrical contact that have been provided in said first surface of said molded plastic part, said points of electrical contact that have been provided in said first surface of said molded plastic part being in contact with said semiconductor devices that have been provided in or on the front side of said BGA chip;
   providing a BGA device carrier;
   exposing the backside of said BGA chip, then; splitting said BGA device into two parts by physically removing said printed circuit board substrate from said molded plastic part; and
   performing BGA chip analysis.

2. The method of claim 1, wherein said BGA device carrier is a structure of cubic or approximate cubic design made of wax wherein an opening is provided with the inside dimensions of said opening being equal to or slightly larger than the outside dimensions of said molded plastic part of said BGA device.

3. The method of claim 1 wherein said exposing said backside of said BGA chip is:
   mounting said BGA device within said BGA device carrier whereby the contact ball grid of said BGA device provided in said first surface of said BGA device substrate is facing away from said device carrier;
   grinding said BGA device backside until the backside of said BGA chip is exposed;
   removing remaining resin from said exposed backside of said BGA chip; and
   polishing said exposed backside of said BGA chip.

4. A method for accessing a BGA semiconductor chip in a plastic packaged module, said plastic packaged module having a printed circuit board substrate and a molded plastic part, the BGA semiconductor chip being embedded within said molded plastic part and having a front side facing said printed circuit board substrate and a backside facing away from said printed circuit board substrate, said backside of said BGA chip having a plurality of contact zones connected by metal wires to a ball grid array of an BGA, comprising the steps of:
   providing a BGA device;
   providing a BGA device carrier;
   positioning said BGA device inside said BGA device carrier;
   creating an opening in said BGA device entering the BGA device from said backside;
   removing remaining resin from within said opening;
   polishing BB said BGA device within said opening created in said BGA device, then;
   separating said printed circuit substrate from said molded plastic part by splitting said BGA device into two parts, thereby physically removing said printed circuit board substrate from said molded plastic part; and
   biasing said BGA semiconductor chip while performing backside emission analysis.

5. The method of claim 4 wherein said BGA device carrier comprises a body of cubic or approximate cubic configuration made of wax wherein an opening is provided with the inside dimensions of said opening being equal to or slightly larger than the outside dimensions of said molded plastic part of said BGA module.

6. The method of claim 4 wherein said step of creating an opening in said BGA device is using a semiconductor circuit metal grinder with a granularity of 60 um at a rotating speed of about 300 rpm and a conventional manual polisher until the surface of the BGA chip is reached.

7. The method of claim 4 wherein the step of removing said remaining resin from within said opening of the BGA chip is a fine oxide plasma etching of said BGA device.

8. The method of claim 4 wherein the step of removing said remaining resin from within said opening of the BGA chip is subjecting said supporting BGA device to thermal shock within the area of said opening.

9. The method of claim 8 wherein said thermal shock treatment consists of immersing said BGA device in a pure nitric bath that is heated to a temperatures of approximately 120 degrees C. for about 8 minutes after which said BGA device is submitted to quick cooling, further removing remaining residue on the BGA device by again immersing said BGA device in hot pure acid for about 3 to 4 minutes.

10. The method of claim 4 wherein said performing BGA device backside emission analysis is biasing and probing said BGA chip thereby applying electrical signals to the BGA chip by probing second bond contact points within the backside of the molded plastic part.

* * * * *